United States Patent
Zhang

(10) Patent No.: US 9,378,074 B2
(45) Date of Patent: Jun. 28, 2016

(54) SERVER SYSTEM

(71) Applicants: Inventec (Pudong) Technology Corporation, Shanghai (CN); INVENTEC CORPORATION, Taipei (TW)

(72) Inventor: Song Zhang, Shanghai (CN)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 143 days.

(21) Appl. No.: 14/328,847

(22) Filed: Jul. 11, 2014

(65) Prior Publication Data

US 2015/0324266 A1    Nov. 12, 2015

(30) Foreign Application Priority Data

May 7, 2014  (CN) .......................... 2014 1 0189093

(51) Int. Cl.
 *G06F 11/263* (2006.01)
 *G06F 11/07* (2006.01)

(52) U.S. Cl.
 CPC .............. *G06F 11/07* (2013.01); *G06F 11/263* (2013.01)

(58) Field of Classification Search
 CPC ... G06F 11/263; G06F 11/267; G06F 21/572; G06F 9/4401; G06F 9/4406
 See application file for complete search history.

(56) References Cited

U.S. PATENT DOCUMENTS

| 7,478,299 B2 | 1/2009 | Brandyberry et al. |
| 7,870,455 B2 * | 1/2011 | Mayer .................. G06F 11/267 714/37 |
| 8,234,531 B2 * | 7/2012 | Mayer .................. G06F 11/267 714/37 |
| 8,347,158 B2 * | 1/2013 | Mayer .................. G06F 11/267 714/37 |
| 2008/0005586 A1 * | 1/2008 | Munguia ............. G06F 12/1408 713/189 |

FOREIGN PATENT DOCUMENTS

| CN | 101930381 A | 12/2010 |
| TW | 201341811 A | 10/2013 |

* cited by examiner

*Primary Examiner* — Nadeem Iqbal

(74) *Attorney, Agent, or Firm* — CKC & Partners Co., Ltd.

(57) ABSTRACT

A server system includes a system on chip (SOC), a baseboard management controller (BMC), a first switch and a connector. The SOC has a hardware debugging test (HDT) interface to generate a HDT signal. The BMC has a programming interface to generate a programming signal. The first switch receives the HDT signal and the programming signal. The connector couples with the first switch. A first control signal controls the first switch to select one of the HDT signal and the programming signal to output to the connector. When the connector receives the HDT signal, a debugging apparatus debugs the SOC according to the HDT signal. When the connector receives the programming signal, a programming apparatus performs a programming process for the BMC according to the programming signal.

11 Claims, 6 Drawing Sheets

SERVER SYSTEM

RELATED APPLICATIONS

This application claims priority to Chinese Application Serial Number 201410189093.7, filed May 7, 2014, the entirety of which is herein incorporated by reference.

BACKGROUND

1. Field of Invention

The invention relates to a server system, and particularly relates to a server system that may use a same connector to transfer a programming signal and a HDT signal.

2. Description of Related Art

When a computer system is manufactured, a debugging process is performed to debug the system on chip (SOC) on a motherboard to find out where and why a failure occurs. Typically, a debugging apparatus is connected to a debugging port of a SOC to receive a hardware debugging test (HDT) signal form the SOC and to perform the debugging process.

Today, the computer system develops towards compact volume and lightweight, but the debugging port having 20 pins needs a lot of area in the motherboard. With the area reduction of the motherboard, debugging port is only disposed in a single motherboard, which limits the number of debugging port. That is, not each SOC has a corresponding debugging port. Therefore, additional test points are disposed on the motherboard to debug the SOCs without the corresponding debugging ports. These test points in the SOCs for debugging can only be connected to additional debugging port using fly line structure to perform a debugging process. However, such additional connection procedure is apt to cause a broken fly line and thus affect the debugging process.

Therefore, there is a need to increase the quality of the debugging process but to keep the area of the motherboard.

SUMMARY

Accordingly, the present invention provides a server system comprising at least one system on chip (SOC), a baseboard management controller (BMC), a first switch and a connector. The SOC has a hardware debugging test (HDT) interface. The HDT interface generates a HDT signal. The BMC has a programming interface. The programming interface generates a programming signal. The first switch receives the HDT signal and the programming signal. The connector couples with the first switch. A first control signal controls the first switch to select one of the HDT signal and the programming signal to output to the connector. When the connector receives the HDT signal, a debugging apparatus debugs the at least one SOC according to the HDT signal. When the connector receives the programming signal, a programming apparatus performs a programming process for the BMC according to the programming signal.

In an embodiment, the server system further comprises a complex programmable logic device (CPLD) coupling with the first switch. When the server system is in a standby state and the at least one SOC is not being powered, the first switch transfers the programming signal to the connector, and data in the BMC is programmed by the programming apparatus through the connector. When the at least one SOC is powered, the at least one SOC generates a PWR_OK signal to trigger the CPLD to generate the first control signal to control the first switch to transfer the HDT signal to the connector, and the at least one SOC is debugged by the debugging apparatus through the connector.

In an embodiment, the first switch is a CPLD and the first control signal is a PWR_OK signal. When the server system is in a standby state and the at least one SOC is not being powered, the CPLD transfers the programming signal to the connector, and data in the BMC is programmed by the programming apparatus through the CPLD. When the at least one SOC is powered, the at least one SOC generates the PWR_OK signal to control the CPLD to transfer the HDT signal to the connector, and the at least one SOC is debugged by the debugging apparatus through the CPLD.

In an embodiment, the at least one SOC comprises a first SOC, a second SOC, a third SOC and a fourth SOC. Each of the first SOC, the second SOC, the third SOC and the fourth SOC has a hardware debugging test (HDT) interface, wherein the HDT interface generates a HDT signal.

In an embodiment, the server system further comprises a second switch and a controller. The second switch couples with the first SOC, the second SOC, the third SOC and the fourth SOC. The controller couples with the second switch, wherein the controller generates a selection signal to control the second switch to select one of the first SOC, the second SOC, the third SOC and the fourth SOC to output a corresponding HDT signal to the first switch.

In an embodiment, when the server system is in a standby state and the first SOC, the second SOC, the third SOC and the fourth SOC are not being powered, the first switch transfers the programming signal to the connector, and data in the BMC is programmed by the programming apparatus through the first switch. When the first SOC, the second SOC, the third SOC and the fourth SOC are powered, each SOC generates a PWR_OK signal, the controller controls the second switch to select one of the first. SOC, the second SOC, the third SOC and the fourth SOC to output a corresponding PWR_OK signal to control the first switch to transfer a corresponding HDT signal to the connector, and the corresponding SOC is debugged by the debugging apparatus through the first switch and the second switch. The HDT signal comprises the PWR_OK signal.

In an embodiment, the first switch is a CPLD and the server system further comprises a controller couples with the CPLD. The controller generates a selection signal to control the CPLD to select one of the first SOC, the second SOC, the third SOC and the fourth SOC to output a corresponding HDT signal to the connector.

In an embodiment, when the server system is in a standby state and the first SOC, the second SOC, the third SOC and the fourth SOC are not being powered, the CPLD transfers the programming signal to the connector, and data in the BMC is programmed by the programming apparatus through the CPLD. When the first SOC, the second SOC, the third SOC and the fourth SOC are powered, the controller generates a selection signal to control the CPLD to select one of the first SOC, the second SOC, the third SOC and the fourth SOC to output a corresponding HDT signal to the connector, and the corresponding SOC is debugged by the debugging apparatus through the CPLD.

In an embodiment, the first switch is a CPLD. When the server system is in a standby state and the first SOC, the second SOC, the third SOC and the fourth SOC are not being powered, the CPLD transfers the programming signal to the connector, and data in the BMC is programmed by the programming apparatus through the CPLD. When only one SOC is powered to generate a PWR_OK signal, the PWR_OK signal controls the CPLD to transfer a corresponding HDT signal to the connector, and the corresponding SOC is debugged by the debugging apparatus through the CPLD.

In an embodiment, the first switch is a CPLD. When the first SOC, the second SOC, the third SOC and the fourth SOC are not being powered, the CPLD transfers the programming signal to the connector, and data in the BMC is programmed by the programming apparatus through the CPLD. When the first SOC, the second SOC, the third SOC and the fourth SOC are powered, each SOC generates a PWR_OK signal, the CPLD selects one of the first SOC, the second SOC, the third SOC and the fourth SOC according to the states of the PWR_OK signals to output a corresponding HDT signal to the connector, and the corresponding SOC is debugged by the debugging apparatus through the CPLD.

In an embodiment, the HDT signal further comprises two general purpose input/output (GPIO) signals, the debugging apparatus issues a selection signal to the CPLD to select one of the CPLD selects one of the first SOC, the second SOC, the third SOC and the fourth SOC according to the GPIO) signals to output a corresponding HDT signal.

The present invention further provides a server system comprising a system on chip (SOC), a baseboard management controller (BMC) and a first connector. The SOC has a hardware debugging test (HDT) interface. The HDT interface has a plurality of pins to output a HDT signal. The BMC manages the server system. The first connector has pins. The first connector is a programming connector of the BMC. Part of the pins of the first connector transfer programming signal when the BMC is programmed, and the other pins of the first connector transfer part of the HDT signal.

In an embodiment, the server system further comprises a second connector. Part of the pins of the HDT interface couples with the pins of the first connector for transferring the HDT signal, and the other pins of the HDT interface couple with the second connector to transfer the HDT signal to a debugging apparatus.

In an embodiment, the server system further comprises a cable line. One end of the cable line couples with the first connector and the second connector and the other end of the cable line couples with the debugging apparatus.

Accordingly, by switching the switch, the signal from a SOC HDT interface and the signal form a BMC programming interface are transferred to the connector in different time. Therefore, the SOC HDT interface and the BMC programming interface can use a same connector.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
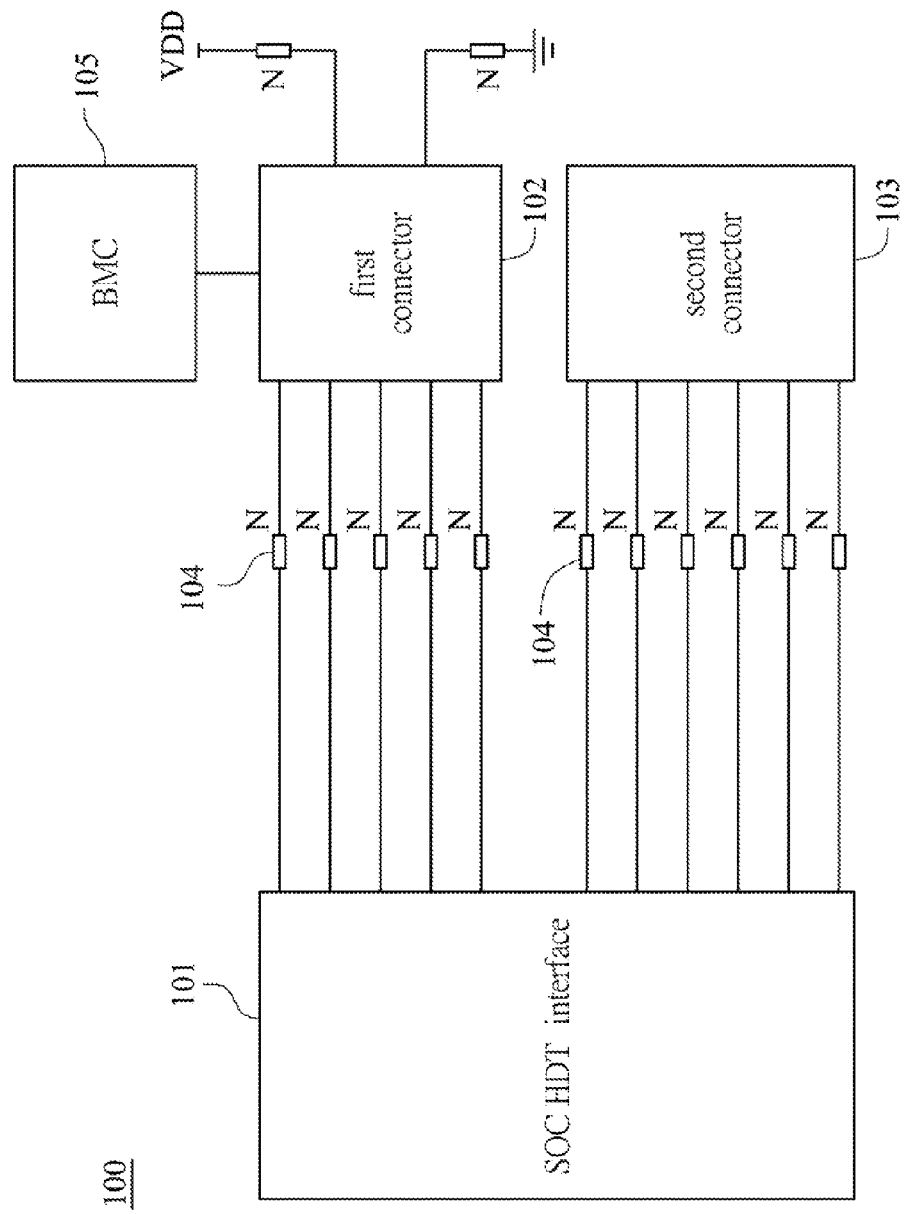
FIG. 1 illustrates a schematic diagram of a server system according to an embodiment of the invention.

Reference will now be made in detail to the present embodiments of the invention, examples of which are illustrated in the accompanying drawings. Wherever possible, the same reference numbers are used in the drawings and the description to refer to the same or like parts.

FIG. 1 illustrates a schematic view of a server system. A server system 100 includes a system on chip (SOC) with a SOC hardware debugging test (HDT) interface 101, a first connector 102, a second connector 103 and a baseboard management controller (BMC) 105. The BMC 105 manages the server 100. The SOC HDT interface 101 includes 11 pins to transfer a HDT signal to a debugging apparatus. The first connector 102 is a programming port of the BMC 105. The second connector 103 has 6 pins arranged in a 2×3 type. Typically, the SOC HDT interface 101 transfers the HDT signal to the debugging apparatus through a debugging port embedded in the motherboard. However, because the area of the motherboard is limited, it is very difficult to embed an additional debugging port in the motherboard. On the other hand, the programming port (the first connector 102) of the BMC has 20 pins. However, only 13 pins of the 20 pins of the programming port (the first connector 102) are needed to transfer the programming signal for renewing the data of the BMC and to receive the power signal and ground signal. Therefore, the present invention uses the remaining 7 pins of the programming port (the first connector 102) to receive the HDT signal from 5 pins of the SOC HDT interface 101 when the SOC is debugged, and to receive the power signal VDD and the ground signal. Moreover, the HDT signal from other 6 pins of the SOC HDT interface 101 is transferred to the second connector 103. Therefore, the whole HDT signal from the SOC HDT interface 101 is transferred to the debugging apparatus through the first connector 102 and the second connector 103. That is, 5 pins of the SOC HDT interface 101 is connected to the pins of the first connector 102 that not used to transfer programming signal and 6 pins of the SOC HDT interface 101 connected to the second connector 103. Therefore, the first connector 102 not only transfers the programming signal to renew the BMC 105 but also transfers partial the HDT signal from the SOC HDT interface 101. The remaining HDT signal from the SOC HDT interface 101 is transferred to second connector 103. Accordingly, the HDT signal can be transferred through the first connector 102 and the second connector 103 having 6 pins. Therefore, it is not necessary to embed an additional debugging port in the motherboard for the server system 100. Moreover, the volume of the second connector 103 having 6 pins is much less than that of the debugging port having 20 pins. The required area of the second connector 103 in the motherboard is less that that of the debugging port. Therefore, the whole volume of the motherboard is reduced.

In another embodiment, resistors 104 having 0 ohm are disposed in the wires between the SOC HDT interface 101 and the first connector 102 and between the SOC HDT interface 101 and the second connector 103 to prevent the programming signal being affected resulting from connection with the SOC HDT interface 101. When the programming signal is transferred to the BMC 105, the resistors 104 do not be connected to the wires. Only when the HDT signals are transferred through the wires, the resistors 104 are connected to the wires. Therefore, the transferring of the programming signal in the wires is not affected. Moreover, the first connector 102 is separated from the second connector 103. Therefore, it is necessary to redesign the wires between the SOC HDT interface 101 and the first connector 102 and the second connector 103. Moreover, a cable line is used to transfer the HDT signal to the debugging apparatus from the first connector 102 and the second connector 103. One end of the cable line is connected to the debugging apparatus and the other end of the cable line is connected to the first connector 102 and the second connector 103 respectively.

Figure 2:
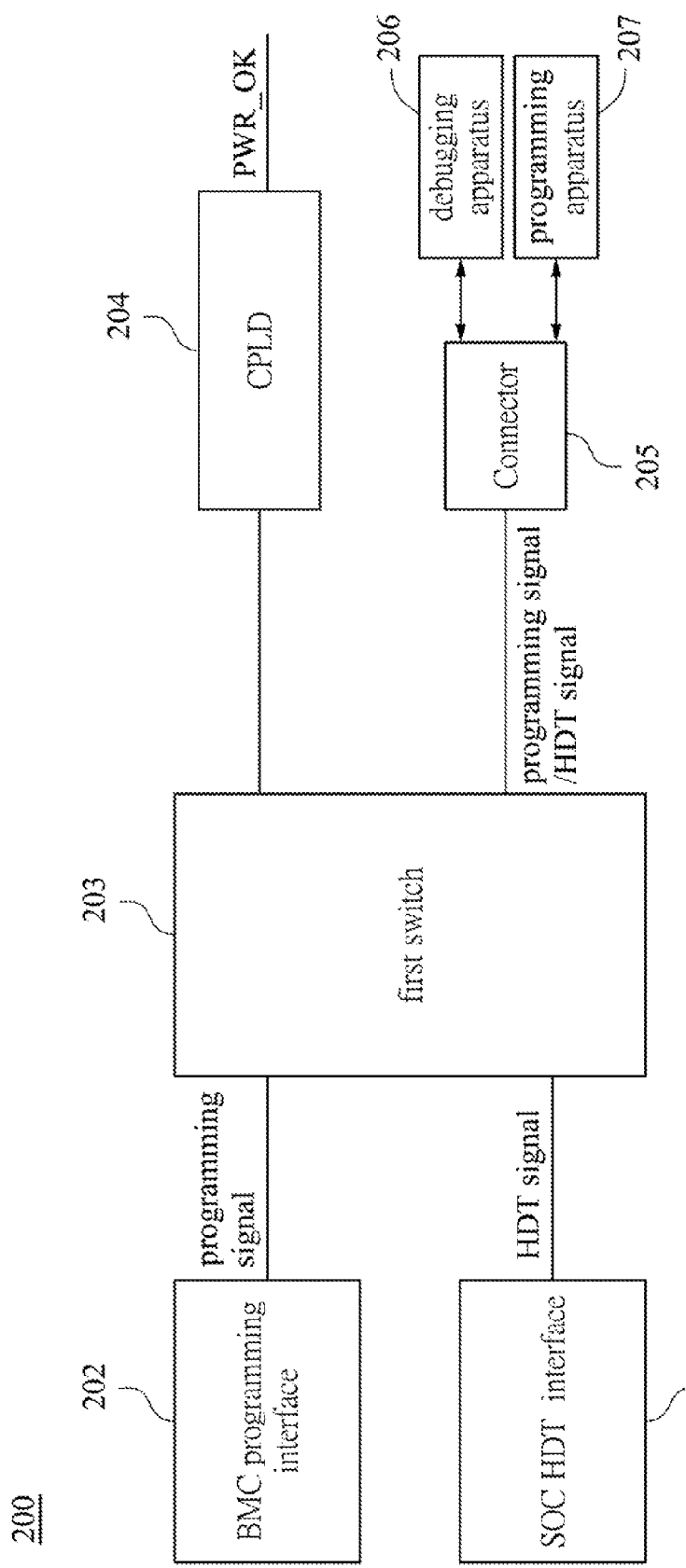
FIG. 2 illustrates a schematic diagram of a server system according to another embodiment of the invention.

FIG. 2 illustrates a schematic diagram of a server system according to another embodiment of the invention. The server system 200 comprises a SOC HDT interface 201, a BMC programming interface 202, a first switch 203, a complex programmable logic device (CPLD) 204, and a connector 205. The connector 205 has at least 20 pins. The CPLD 204 generates a control signal CS to switch the first switch 203. Because both the typical debugging port and the BMC programming port have 20 pins, the CPLD 204 switch the first switch 203 to select the SOC HDT interface 201 or the BMC programming interface 202 to transfer corresponding signal to the connector 205. In an embodiment, the SOC HDT interface 201 transfers the HDT signal to process a debugging process of SOCs by a debugging apparatus 206. The BMC programming interface 202 transfers the programming signal to process a programming process of the BMC by a programming apparatus 206. Accordingly, a common connector, connector 205, is used by the SOC HDT interface 201 and the BMC programming interlace 202 through the first switch 203. It is not necessary to embed an additional debugging port in the motherboard. In an embodiment, a SOC may generate a PWR_OK signal to trigger CPLD 204 to generate a control signal CS. For example, when the system 200 is in a standby state, both the BMC and the CPLD 204 are in a working state. At this time, the first switch 203 selects the BMC programming interface 202 to transfer the programming signal to the connector 205. Therefore, a programming process is performed to renew the data stored in the memory of the BMC through the first switch 203 and the connector 205. When the system 200 is powered on already, the SOC is in an on state. At this time, the SOC may generate a PWR_OK signal to trigger CPLD 204 to generate a control signal CS. The control signal CS controls the first switch 203 to selects the SOC HDT interface 201 to transfer the debugging signal to the connector 205. Therefore, a debugging process is performed by a debugging apparatus 206 to debug the SOC through the first switch 203 and the connector 205.

Figure 3:
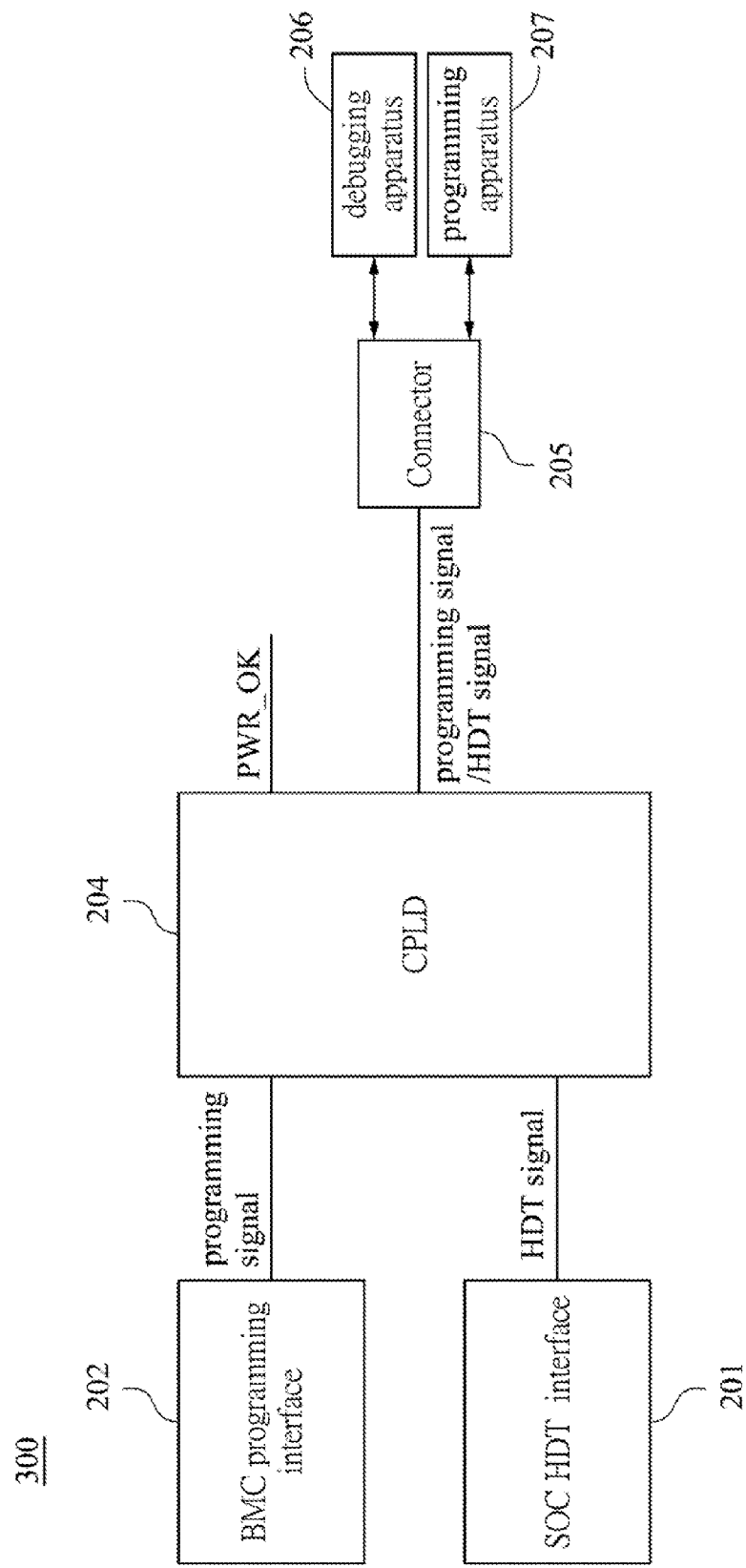
FIG. 3 illustrates a schematic diagram of a server system according to another embodiment of the invention.

In another embodiment, the CPLD 204 is used to select the SOC HDT interface 201 and the BMC programming interface 202. Accordingly, it is not necessary to use the first switch 203. FIG. 3 illustrates a schematic diagram of a server system according to another embodiment of the invention. The server system 300 comprises a SOC HDT interface 201, a BMC programming interface 202, a complex programmable logic device (CPLD) 204, and a connector 205. The connector 205 has at least 20 pins. A SOC may generate a PWR_OK signal to trigger CPLD 204 to select the SOC HDT interface 201 or the BMC programming interface 202 to transfer corresponding signal to the connector 205. In an embodiment, the SOC HDT interface 201 transfers the HDT signal to process a debugging process of SOCs by a debugging apparatus 206. The BMC programming interface 202 transfers the programming signal to process a programming process of the BMC by a programming apparatus 206. Accordingly, a common connector, connector 205, is used by the SOC HDT interface 201 and the BMC programming interface 202. For example, when the system 300 is in a standby state, both the BMC and the CPLD 204 are in a working state. At this time, the CPLD 204 selects the BMC programming interface 202 to transfer the programming signal to the connector 205. Therefore, a programming process is performed to renew the data stored in the memory of the BMC through the CPLD 204 and the connector 205. When the system 300 is powered on already, the SOC is in an on state. At this time, the SOC may generate a PWR_OK signal to control the CPLD 204 to select the SOC HDT interface 201 to transfer the debugging signal to the connector 205. Therefore, a debugging process is performed by the debugging apparatus 206 to debug the SOC through the CPLD 204 and the connector 205.

Figure 4:
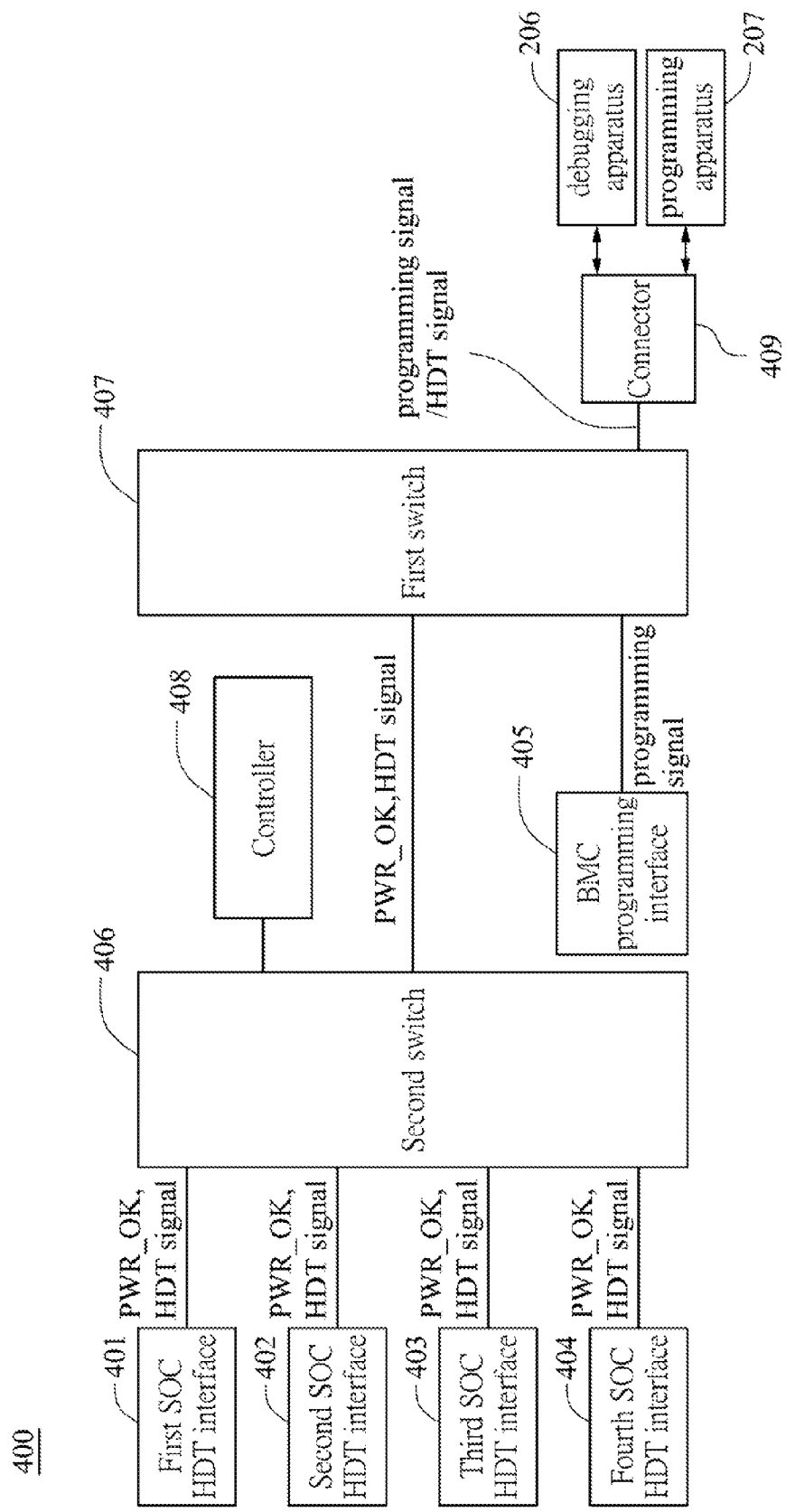
FIG. 4 illustrates a schematic diagram server system according to another embodiment of the invention.

It is noticed that the above embodiments disclose a structure that both the SOC HDT interface 201 and the BMC programming interface 202 are coupled to a same connector, the connector 205. However, in another embodiment, a plurality SOC HDT interfaces and a BMC programming interface 202 are also coupled to a same connector. FIG. 4 illustrates a schematic diagram of a server system according to another embodiment of the invention. In this embodiment, four SOC HDT interfaces and a BMC programming interface are coupled to a same connector. However, the present invention does not lime the number of the SOC HDT interfaces. The server system 400 comprises a first SOC HDT interface 401, a second SOC HDT interface 402, a third SOC HDT interface 403, a fourth SOC HDT interface 404, a BMC programming interface 405, a first switch 407, a second switch 406, a controller 408 and a connector 409. The connector 409 has at least 20 pins. The controller 408 generates a select signal to switch the second switch 406 to select one of the first SOC HDT interface 401, the second SOC HDT interface 402, the third SOC HDT interface 403 and the fourth SOC HDT interface 404. In an embodiment, the controller 408 uses two jumpers to connect with the ground and the power line respectively to generate 4 selection signals, 00, 01, 10, and 11, to control the second switch 406. A PWR_OK signal controls the first switch 407 to output a corresponding HDT signal from a SOC HDT interface that is selected by the second switch 406 to the connector 409.

When the system 400 is in a standby state, the BMC is in a working state but the SOCs are not in a working state. At this time, the first switch 407 selects the BMC programming interface 405 to transfer the programming signal to the connector 409. Therefore, a programming process is performed by a programming apparatus 207 to renew the data stored in the memory of the BMC through the first switch 407 and the connector 409. When the system 400 is powered on already, all the SOCs are in a working state. At this time, each of the SOCs may generate a PWR_OK signal. Accordingly, the selection signal, 00, 01, 10, or 11, generated by the two jumpers of the controller 408 controls the second switch 406 to select one of the first SOC HDT interface 401, the second SOC HDT interface 402, the third SOC HDT interface 403 and the fourth SOC HDT interface 404 to output corresponding PWR_OK signal and HDT signal to the first switch 407. When the first switch 407 receives the PWR_OK signal and HDT signal, the first switch 407 is switched to output the HDT signal to the connector 409. Therefore, a debugging process is performed by a debugging apparatus 206 to debug the corresponding SOC through the first switch 407, the second switch 406 and the connector 409.

Figure 5:
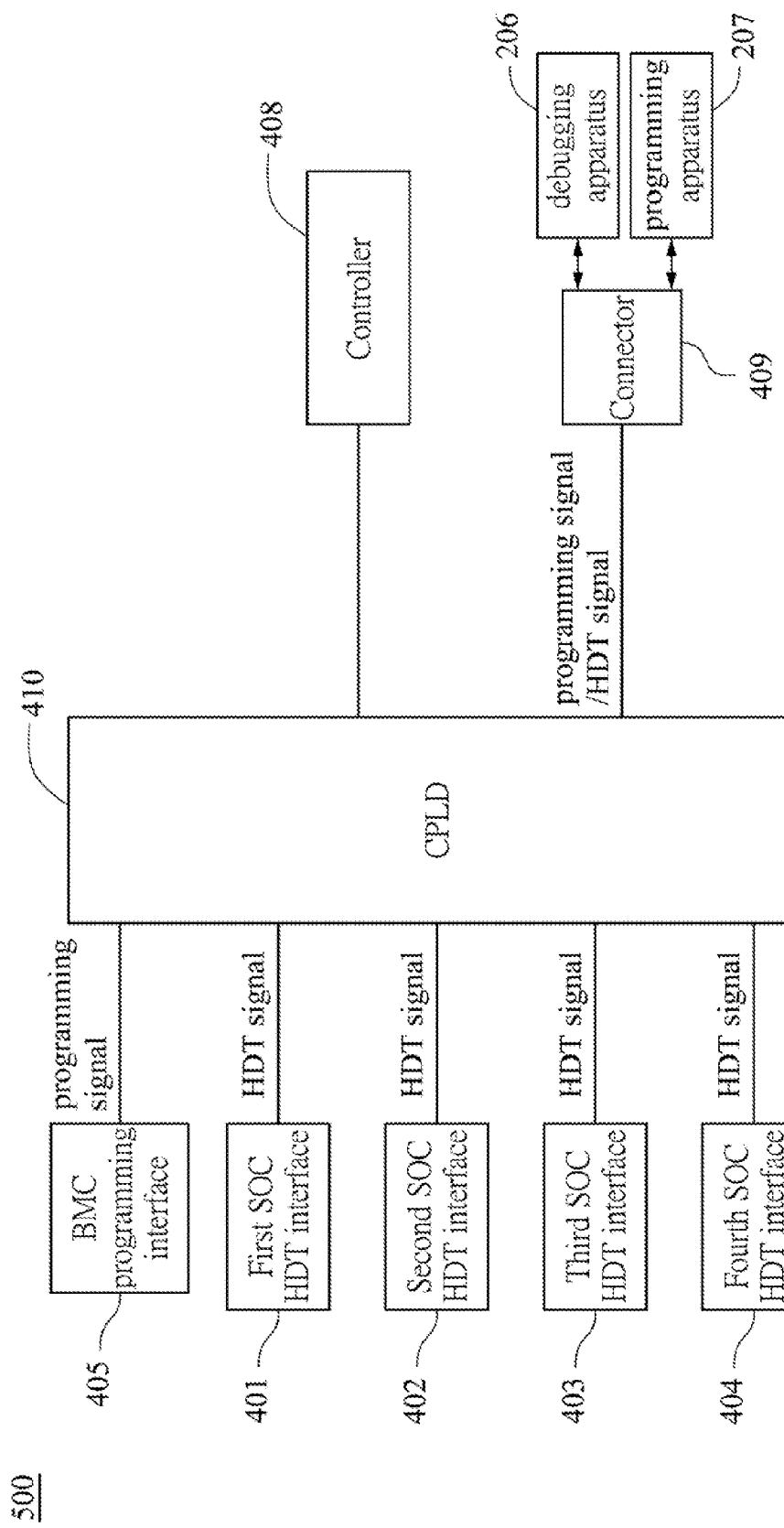
FIG. 5 illustrates a schematic diagram of a server system according to another embodiment of the invention.

In another embodiment, a CPLD is used to select the SOC HDT interfaces and the BMC programming interface. Accordingly, it is not necessary to use the first switch 407 and the second switch 406. FIG. 5 illustrates a schematic diagram of a server system according to another embodiment of the invention. The server system 500 comprises a first SOC HDT interface 401, a second SOC HDT interface 402, a third SOC HDT interface 403, a fourth SOC HDT interface 404, a BMC programming interface 405, a CPLD 410, a controller 408 and a connector 409. The connector 409 has at least 20 pins. The controller 408 generates a select signal to control the CPLD 410 to select one of the BMC programming interface 405, the first SOC HDT interface 401, the second SOC HDT interface 402, the third SOC HDT interface 403 and the fourth SOC HDT interface 404. In an embodiment, the controller 408 uses two jumpers to connect with the ground and the power line respectively to generate 4 selection signals, 00, 01, 10, and 11, to control the CPLD 410.

When the system 500 is in a standby state, both the BMC and the CPLD 410 are in a working state but the SOCs are not being powered. At this time, the CPLD 410 selects the BMC programming interface 405 to transfer the programming signal to the connector 409. Therefore, a programming process is performed by a programming apparatus 207 to renew the data stored in the memory of the BMC through the CPLD 410. When the system 500 is powered on already, the selection signal, 00, 01, 10, or 11, generated by the two jumpers of the controller 408 controls the CPLD 410 to select one of the first SOC HDT interface 401, the second SOC HDT interface 402, the third SOC HDT interface 403 and the fourth SOC HDT interface 404 to output corresponding HDT signal to the connector 409. Therefore, a debugging process is performed by a debugging apparatus 206 to debug the corresponding SOC through the CPLD 410 and the connector 409.

Figure 6:
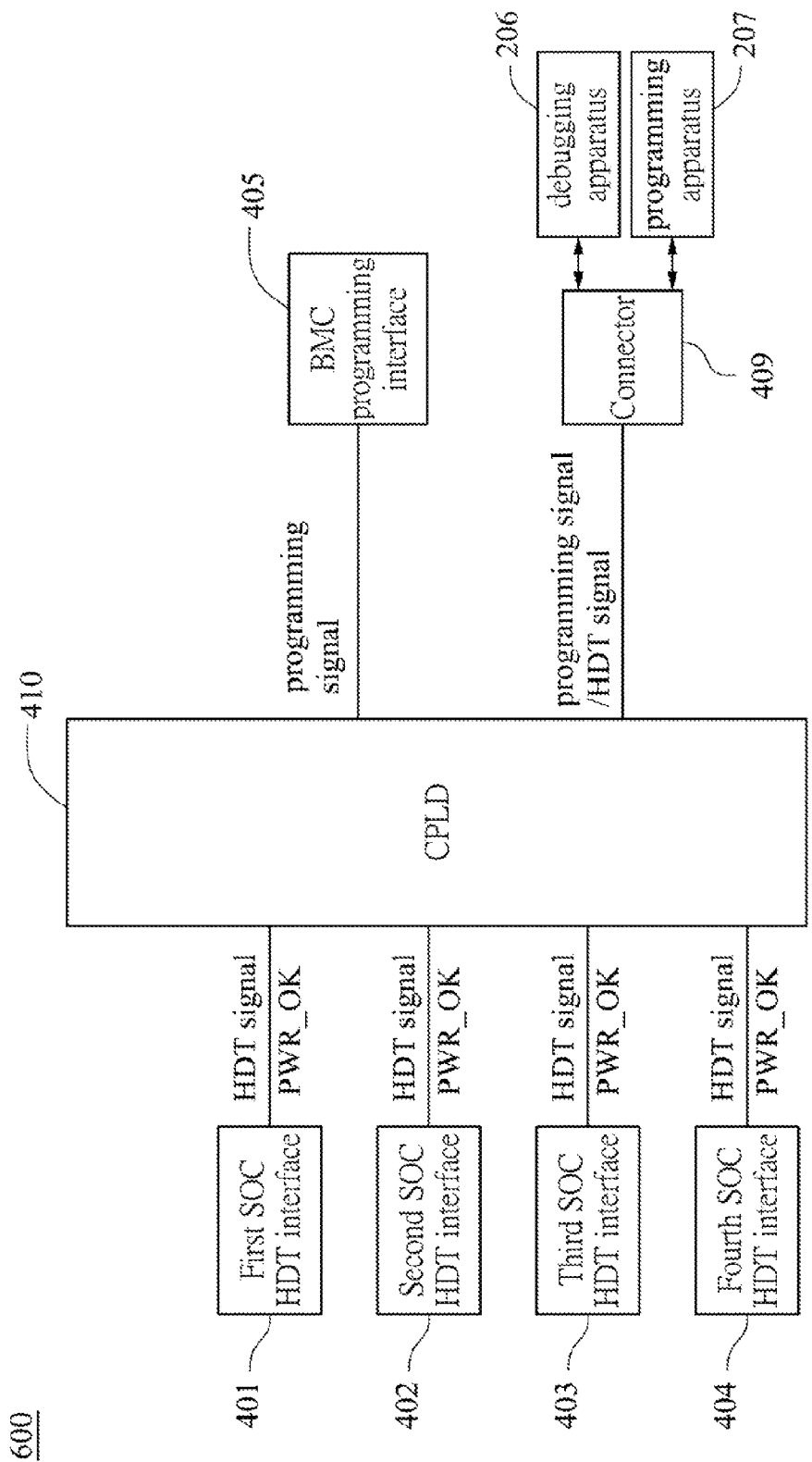
FIG. 6 illustrates a schematic diagram of a server system according to another embodiment of the invention.

In the above embodiments, the controller 408 has to use the two jumpers to generate the selection signal, 00, 01, 10, or 11, to select one of the SOCs to debug before debugging process. However, in the following embodiment, it is not necessary for the controller 408 to select one of the SOCs to debug before a debugging process is performed, but the debugging apparatus issues a selection signal to the CPLD to select one of the SOCs while a debugging process is performed. FIG. 6 illustrates a schematic diagram of a server system according to another embodiment of the invention. The server system 600 comprises a first SOC HDT interface 401, a second SOC HDT interface 402, a third SOC HDT interface 403, a fourth SOC HDT interface 404, a BMC programming interface 405, a CPLD 410 and a connector 409. The connector 409 has at least 20 pins. A debugging apparatus 206 issues a selection signal to control the CPLD 410 to select one of the BMC programming interface 405, the first SOC HDT interface 401, the second SOC HDT interface 402, the third SOC HDT interface 403 and the fourth. SOC HDT interface 404 to output a corresponding HDT signal.

When the system 600 is in a standby state, both the BMC and the CPLD 410 are in a working state but the SOCs are not being powered. At this time, the CPLD 410 selects the BMC programming interface 405 to transfer the programming signal to the connector 409. Therefore, a programming process is performed by a programming apparatus 207 to renew the data stored in the memory of the BMC through the CPLD 410 When the system 600 is powered on already, all SOCs are powered to work. When only one SOC is in a valid working state, this SOC may generate a PWR_OK signal. At this time, the CPLD 410 select this SOC according to the PWR_OK signal to output corresponding HDT signal to the connector 409. Therefore, a debugging process is performed to debug this SOC through the CPLD 410 and the connector 409. On the other hand, when many SOCs are in a valid working state, two general purpose input/output (GM) signals generated by two general purpose input/output pins are added into the HDT signal between the CPLD 410 and the connector 409 to help the CPLD 410 to select one of the SOCs. The two GPIO signals represent a selection signal. Therefore, the two GPIO pins may generate 4 selection signals, 00, 01, 10, and 11. The debugging apparatus 206 issues a selection signal to the CPLD 410 to select one of the SOCs to output a corresponding HDT signal. In an embodiment, a selection button is disposed in the debugging apparatus 206 to select one of the SOCs. When a debugging process is performed by a debugging apparatus 206, a user may push the selection button to select one of the SOC HDT interfaces. That is, when the selection button is pushed, two GPIO signals are transferred to the CPLD 410 from the debugging apparatus 206 through the connector 409. According to the two GPIO signals, the CPLD 410 selects one of the first SOC HDT interface 401, the second SOC HDT interface 402, the third SOC HDT interface 403 and the fourth SOC HDT interface 404 to output a corresponding HDT signal to the connector 409. Therefore, a debugging process is performed by a debugging apparatus 206 to debug this SOC through the CPLD 410 and the connector 409.

Accordingly, by switching the switch, the signal from a SOC HDT interface and the signal form a BMC programming interface are transferred to the connector in different time. Therefore, the SOC HDT interface and the BMC programming interface can use a same connector. In other words, the volume of the motherboard is reduced. Moreover, it is not necessary to arrange any jumper wire in the motherboard, which increases the test quality.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A server system, comprising:
   at least one system on chip (SOC) having a hardware debugging test (HDT) interface to generate a HDT signal;
   a baseboard management controller (BMC) having a programming interface to generate a programming signal;
   a first switch receiving the HDT signal and the programming signal; and
   a connector coupling with the first switch,
   wherein a first control signal controls the first switch to select one of the HDT signal and the programming signal to output to the connector;
   when the connector receives the HDT signal, a debugging apparatus debugs the at least one SOC according to the HDT signal; and
   when the connector receives the programming signal, a programming apparatus performs a programming process for the BMC according to the programming signal,
   wherein the server system further comprises a complex programmable logic device (CPLD) coupling with the first switch, wherein
   when the server system is in a standby state and the at least one SOC is not being powered, the first switch transfers the programming signal to the connector, and data in the BMC is programmed by the programming apparatus through the connector; and
   when the at least one SOC is powered, the at least one SOC generates a PWR_OK signal to trigger the CPLD to generate the first control signal to control the first switch to transfer the HDT signal to the connector, and the at least one SOC is debugged by the debugging apparatus through the connector.

2. The server system of claim 1, wherein the first switch is a CPLD and the first control signal is a PWR_OK signal, wherein when the server system is in a standby state and the at least one SOC is not being powered, the CPLD transfers the programming signal to the connector, and data in the BMC is programmed by the programming apparatus through the CPLD; and when the at least one SOC is powered, the at least one SOC generates the PWR_OK signal to control the CPLD to transfer the HDT signal to the connector, and the at least one SOC is debugged by the debugging apparatus through the CPLD.

3. The server system of claim 1, wherein the at least one SOC comprises a first SOC, a second SOC, a third SOC and a fourth SOC, each of the first SOC, the second SOC, the third SOC and the fourth SOC having a hardware debugging test (HDT) interface, wherein the HDT interface generates a HDT signal.

4. The server system of claim 3, further comprising:

a second switch coupling with the first SOC, the second SOC, the third SOC and the fourth SOC; and a controller coupling with the second switch, wherein the controller generates a selection signal to control the second switch to select one of the firs SOC, the second SOC, the third SOC and the fourth SOC to output a corresponding HDT signal to the first switch.

5. The sewer system of claim 4, wherein when the server system is in a standby state and the first SOC, the second SOC, the third SOC and the fourth SOC are not being powered, the first switch transfers the programming signal to the connector, and data in the BMC is programmed by the programming apparatus through the first switch; and when the first SOC, the second SOC, the third SOC and the fourth SOC are powered, each SOC generates a PWR_OK signal, the controller controls the second switch to select one of the first SOC, the second SOC, the third SOC and the fourth SOC to output a corresponding PWR_OK signal to control the first switch to transfer a corresponding HDT signal to the connector, and the corresponding SOC is debugged by the debugging apparatus through the first switch and the second switch.

6. The server system of claim 5, wherein the HDT signal comprises the PWR_OK signal.

7. The server system of claim 3, wherein the first switch is a CPLD, and the server system further comprises a controller couples with the CPLD, wherein the controller generates a selection signal to control the CPLD to select one of the first SOC, the second SOC, the third SOC and the fourth SOC to output a corresponding HDT signal to the connector.

8. The server system of claim 7, wherein when the server system is in a standby state and the first SOC, the second SOC, the third SOC and the fourth SOC are not being powered, the CPLD transfers the programming signal to the connector, and data in the BMC is programmed by the programming apparatus through the CPLD; and when the first SOC, the second SOC, the third SOC and the fourth SOC are powered, the controller generates a selection signal to control the CPLD to select one of the first SOC, the second SOC, the third SOC and the fourth SOC to output a corresponding HDT signal to the connector, and the corresponding SOC is debugged by the debugging apparatus through the CPLD.

9. The server system of claim 3, wherein the first switch is a CPLD;

when the server system is in a standby state and the first SOC, the second SOC, the third SOC and the fourth SOC are not being powered, the CPLD transfers the programming signal to the connector, and data in the BMC is programmed by the programming apparatus through the CPLD; and when only one SOC is powered to generate a PWR_OK signal, the PWR_OK signal controls the CPLD to transfer a corresponding HDT signal to the connector, and the corresponding SOC is debugged by the debugging apparatus through the CPLD.

10. The server system of claim 3, wherein the first switch is a CPLD;

when the first SOC, the second SOC, the third SOC and the fourth SOC are not being powered, the CPLD transfers the programming signal to the connector, and data in the BMC is programmed by the programming apparatus through the CPLD; and when the first SOC, the second SOC, the third SOC and the fourth SOC are powered, each SOC generates a PWR_OK signal, the CPLD selects one of the first SOC, the second SOC, the third SOC and the fourth SOC according to the states of the PWR_OK signals to output a corresponding HDT signal to the connector, and the corresponding SOC is debugged by the debugging apparatus through the CPLD.

11. The server system of claim 10, wherein the HDT signal further comprises two general purpose input/output (GPIO) signals, the debugging apparatus issues a selection signal to the CPLD to select one of the first SOC, the second SOC, the third SOC and the fourth SOC according to the GPIO signals to output a corresponding HDT signal.

* * * * *